United States Patent [19]

Tomioka et al.

[11] Patent Number: 4,916,385

[45] Date of Patent: Apr. 10, 1990

[54] INVERTER CIRCUIT

[75] Inventors: Ichiro Tomioka; Masahiro Ueda; Takahiko Arakawa; Toshiaki Hanibuchi; Yoshihiro Okuno, all of Hyogo, Japan

[73] Assignee: Mitsubishi Denki Kkabushiki Kaisha, Tokyo, Japan

[21] Appl. No.: 262,302

[22] Filed: Oct. 25, 1988

[30] Foreign Application Priority Data

Nov. 2, 1987 [JP] Japan .................. 62-277969

[51] Int. Cl.$^4$ .................. G01R 31/28; H03K 19/00
[52] U.S. Cl. .................. 324/158 R; 307/263; 307/542; 307/577
[58] Field of Search .............. 324/73 R; 307/263, 270, 307/443, 446, 448, 520, 542, 577, 579

[56] References Cited

U.S. PATENT DOCUMENTS

| 4,421,994 | 12/1983 | Puri et al. | 307/577 |
| 4,477,741 | 10/1984 | Moser, Jr. | 307/270 |
| 4,479,067 | 10/1984 | Fujita | 307/448 |
| 4,760,279 | 7/1988 | Saito et al. | 307/520 |
| 4,777,389 | 10/1988 | Wu et al. | 307/443 |
| 4,782,252 | 11/1988 | Levy et al. | 307/542 |
| 4,803,383 | 2/1989 | Hirochi | 307/446 |
| 4,820,942 | 4/1989 | Chan | 307/542 |

FOREIGN PATENT DOCUMENTS 2855925 4/1982 Fed. Rep. of Germany .

OTHER PUBLICATIONS

Tony Wong et al., "A High Performance 129K Gate CMOS Array" IEEE 1986 Custom Integrated Circuits Conference, pp. 568–571.

*Primary Examiner*—Ernest F. Karlsen
*Attorney, Agent, or Firm*—Lowe, Price, LeBlanc, Becker & Shur

[57] ABSTRACT

An inverter circuit ($I_3$) is disclosed which includes a P-channel MOSFET (3) and a N-channel MOSFET (4) connected in series between a power supply ($V_{DD}$) and a ground (GND). The inverter circuit further includes a P-channel MOSFET (5) and a N-channel MOSFET (6) connected in parallel between the gates of the FETs (3) and (4). The FETs (3) and (4) have their gates connected to receive testing mode signals ($T_E$). In a testing mode operation, the FET (6) is rendered conductive to allow an input signal to be applied to the gate of the FET (4) through the FET (6). The FET (4), having an on-resistance lower than the FET (3), is driven into conduction in response to the output signal applied through the FET (6), thereby providing a slowly rising output signal. The slow rising output signal is free from undershoot or ringing.

20 Claims, 5 Drawing Sheets

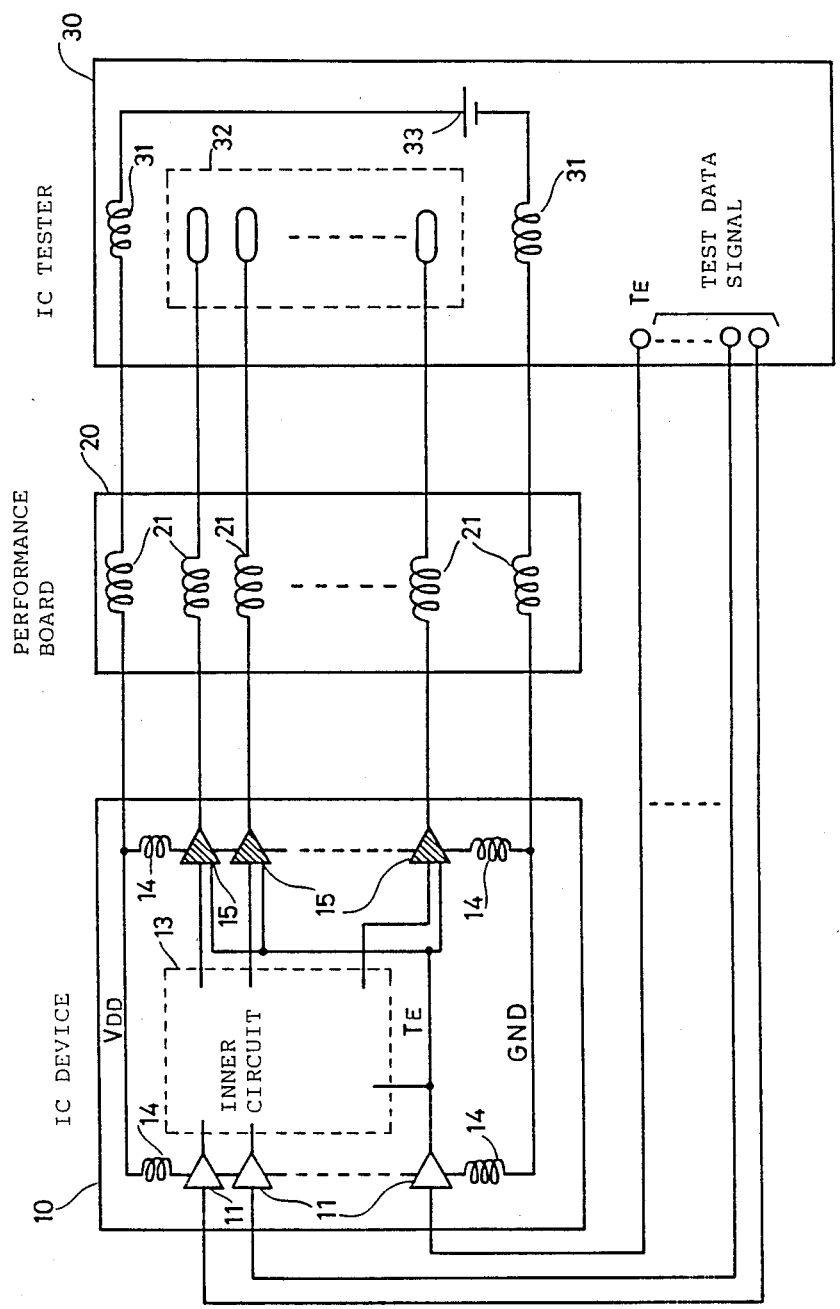

INVERTER CIRCUIT

BACKGROUND OF THE INVENTION

1. Field of the Invention

This invention relates generally to an inverter circuit and in particular to an improved inverter circuit capable of providing highly stable output signals. The present invention has a particular applicability to a buffer circuit for integrated circuit devices.

2. Description of the Prior Art

Referring to FIG. 1, a typical prior art semiconductor integrated circuit device (hereinafter referred to as a IC device) is shown connected to a device for testing the same. Specifically, the IC device 10 to be tested is connected to an IC tester 30 via a performance board 20. The IC device includes an input buffer 11 for receiving test data signals and test enable signals $T_E$ from the IC tester 30, an inner circuit 13 for processing test data, and an output buffer 12 for transferring signals from the inner circuit 13 as outputs. The IC tester 30 contains a comparator circuit 32 to be connected to the IC device to receive outputs signals therefrom representing the test results, and a DC source 33. Supply voltage $V_{DD}$ from the DC source 33 is applied to the IC device 10 through the performance board 20.

In FIG. 2, there is illustrated a prior art output buffer circuit for the IC device which comprises a pair of inverters. The output buffer circuit 12 includes CMOS inverters $I_1$ and $I_2$. One inverter $I_1$ comprises a P-channel MOS field effect transistor (hereinafter referred to as FET) 1 and a N-channel MOSFET 2 which are connected in series between the supply voltage $V_{DD}$ and ground potential GND. The FETs 1 and 2 have their gates connected together to receive input voltage signals $V_{IN}$. The other inverter $I_2$ also includes a P-channel MOSFET 3 and a N-channel MOSFET 4. The gates of the MOSFETs 3 and 4 are conencted to a junction node $N_1$ between FETs 1 and 2. A junction node $N_2$ between the FETs 3 and 4 constitutes an output terminal for the output buffer circuit from which output voltage signals $V_{OUT}$ are supplied.

In FIG. 3, there is illustrated a timing diagram for input and output voltage signals associated with the output buffer circuit 12. In operation, when the input voltage $V_{IN}$ changes from a low "L" level to a high "H" level at a time $t_1$, the high level voltage "H" is applied to the gates of the FETs 1 and 2, thereby rendering the FET 1 non-conductive and the FET 2 conductive. As a result, the high level voltage $V_3$ at the node $N_1$ starts falling off upon the lapse of the delay time provided by the CMOS inverter $I_1$ after time $t_1$, and it settles down to the "L" level through a predetermined time interval. As the voltage $V_3$ on the node $N_1$ drops to the "L" level, the FET 3 is driven conductive, while the FET 4 is driven non-conductive. Consequently, the low level output voltage $V_{OUT}$ at the node $N_2$ starts to rise upon the lapse of the delay time provide by the CMOS inverter $I_2$ after the voltage $V_3$ at the node $N_1$ has dropped to the "L" level, and at time $t_3$ the output signal $V_{OUT}$ reaches the "H" level.

When the input signal $V_{IN}$ shifts from the "H" level down to the "L" level at $t_4$, the FET 1 is turned on while the FET 2 is turned off. Then the voltage $V_3$ at the node $N_1$ begins rising upon the passage of the delay time defined by the CMOS inverter after $t_4$, and it reaches the "H" level through a predetermined time. Upon the voltage $V_3$ at the node $N_1$ assuming the "H" level, the FET 3 is rendered conductive while the FET 4 is rendered non-conductive. The output signal $V_{OUT}$ at the node $N_1$ begins falling at $t_5$ when the delay time provided by the CMOS inverter $I_2$ has lapsed after the voltage $V_3$ on the node $N_1$ shifted up to the "H" level. At $t_6$, the output signal $V_{OUT}$ goes down to the "L" level.

As can be seen in FIG. 3, with the input buffer circuit shown, undesirable undershoot or ringing are caused in the output waveform as the output signal $V_{OUT}$ falls off during the time interval $t_5$–$t_6$. However, no overshoot and ringing are witnessed as the output signal $V_{OUT}$ goes up during the time interval between $t_2$ and $t_3$. The reason for this is as follows.

The time interval $t_5$–$t_6$ during which the output signal $V_{OUT}$ drops from "H" level to the "L" level is relatively short, resulting in a steep downhill slope in the output waveform as shown in FIG. 3. On the other hand, the time interval $t_2$–$t_3$ during which the output signal $V_{OUT}$ rises from the "L" level to the "H" level is relatively long, forming a gentle uphill slope in the output waveform. The rise and fall times of the output waveform are determined by the time it takes for the output capacitance $C_o$ (including a stray capacitance of the inverter and an input capacitance of an external circuit connected to receive the $V_{OUT}$) to be charged and discharged. The charging and discharging times of the output capacitance $C_o$ is proportional to the product of the value of the output capacitance $C_o$ and the on-resistance of the the FETs 3 or 4. Assuming that the output capacitance is fixed, the rise time $t_2$–$t_3$ and the fall time $t_5$–$t_6$ of the CMOS inverter $I_2$ is determined by the on-resistances of the FETs 3 and 4. It should be noted here that, the transistor size being the same, the on-resistance of the FET 3 is larger than that of the FET 4. This is because the high P-channel FET 3 has a small mobility than the N-channel FET 4.

Due to the above-mentioned fact that the on-resistance for the P-channel FET 3 is larger than that of the N-channel FET 4, the charging time (equal to $t_2$–$t_3$ of FIG. 3) of the output capacitance $C_o$ by the output signal $V_{OUT}$ rising from the "L" level to the "H" level is longer than the fall time $t_5$–$t_6$ of the output signal $V_{OUT}$ or the discharge time of the output capacitor $C_o$ where the output voltage $VF_{OUT}$ drops from the "H" level to the "L" level. In short, the rise time of the output signal $V_{OUT}$ is longer than the fall time of the output signal. Phrased differently, the output signal $V_{OUT}$ increases gradually and gently and decreases rapidly and sharply.

Connected to the output of the output buffer is inductance included in the package and the external electrical interconnections as well as the above stated output capacitance $C_o$. Since the impedance of the input buffer is not matched with the external impedance, undershoot and ringing are caused in the output waveform as the output signal $V_{OUT}$ drops to the "L" level. The undershoot and ringing in turn lead to an erroneous operation of externally connected devices.

The IC device 10 having the input buffer circuit 12 of FIG. 1 incorporate therein tends to suffer some problems when put to test procedures. For example, components used to connect the IC device to the IC tester such as IC sockets and the performance board as well as the electrical interconnections within the tester have their own distributed inductances as indicated by the reference numeral 14, 21 and 31 in FIG. 1. These inductances bring about a change in the supply voltage in the IC tester 30 whenever the supply current undergoes a transient change. On the other hand, the logic level of the inputs supplied from the IC tester into the IC device is determined based on the common ground potential GND as a reference voltage. Thus, if the fluctuating supply voltage $V_{DD}$ and GND in the IC tester 30 are transferred into the IC device, the threshold values of the P- and N-channel FETs 1-4 are caused to shift, giving rise to the aforementioned undershoot and ringing. This in turn disturbs the normal test procedures of the IC device.

One prior art of particular interest to this invention is disclosed in a paper by T. Wong et al. entitled, "A High Performance 129k Gate MOS Array". The paper describes two pairs of P- and N-channel MOSFETs which are connected in series between a supply voltage and a ground potential.

SUMMARY OF THE INVENTION

One object of the invention is to provide an inverter capable of providing highly stable output signals.

Another object of the invention is to prevent undesirable undershoot and ringing in the output signals produced by an inverter circuit.

Still another object of the invention is to stabilize the outputs signals produced by an IC device.

Still another object of the invention is to prevent undershoot and ringing in the output signals produced by an IC device.

Still another object of the invention is to obtain output signal from an IC device under testing procedures accurately and exactly representing the test results.

Still another object of the invention is to stabilize the supply voltage of an IC tester used in the test procedures of IC devices.

Briefly stated, an inverter circuit of the invention includes a first FET of one conductivity type and a second FET of the other conductivity type which are connected between a supply voltage and a ground potential. The inverter circuit also includes a delay circuit for delaying input signals under control of a signal for designating a predetermined operating mode. The first FET has its control electrode connected to receive the input signals, and the second FET has its control electrode connected to receive the output signals after they have been delayed by the delay circuit. The second FET has an on-resistance lower than the first FET. Output signals are provided at the junction between the first and second FETs.

In a predetermined mode of operation, the first FET functions in response to the input signals, while the second FET in response to the input signals delayed by the delay circuit. Though the second FET has an on-resistance smaller than the first FET, it is turned on in response to the delayed input signal, thereby preventing a sharp change in the output signal.

In a preferred embodiment of the invention, the delay circuit comprises a third FET of the opposite conductivity type connected to the control electrode of the second FET. The second FET has its control electrode connected to receive the input signals through the third FET. In a predetermined mode of operation, the threshold voltage of the second FET rises in response to a changing level of the input signal. As a result, the conducting timing of the third FET is correspondingly delayed, causing the input signal to be applied to the control electrode of the second FET through the third FET with a time delay.

In another preferred embodiment of the invention, the inverter circuit may be incorporated into the output buffer circuit of an IC device having a testing mode of operation. With the inverter circuit of the invention incorporated, the IC device in the testing mode generates output signals exactly representing the test results.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4A is a schematic illustration showing an interconnection between a semiconductor integrated circuit device having incorporated therein an inverter circuit according to the invention and a testing device for testing the performance of the integrated circuit device;

DESCRIPTION OF THE PREFERRED EMBODIMENTS

Figure 1:
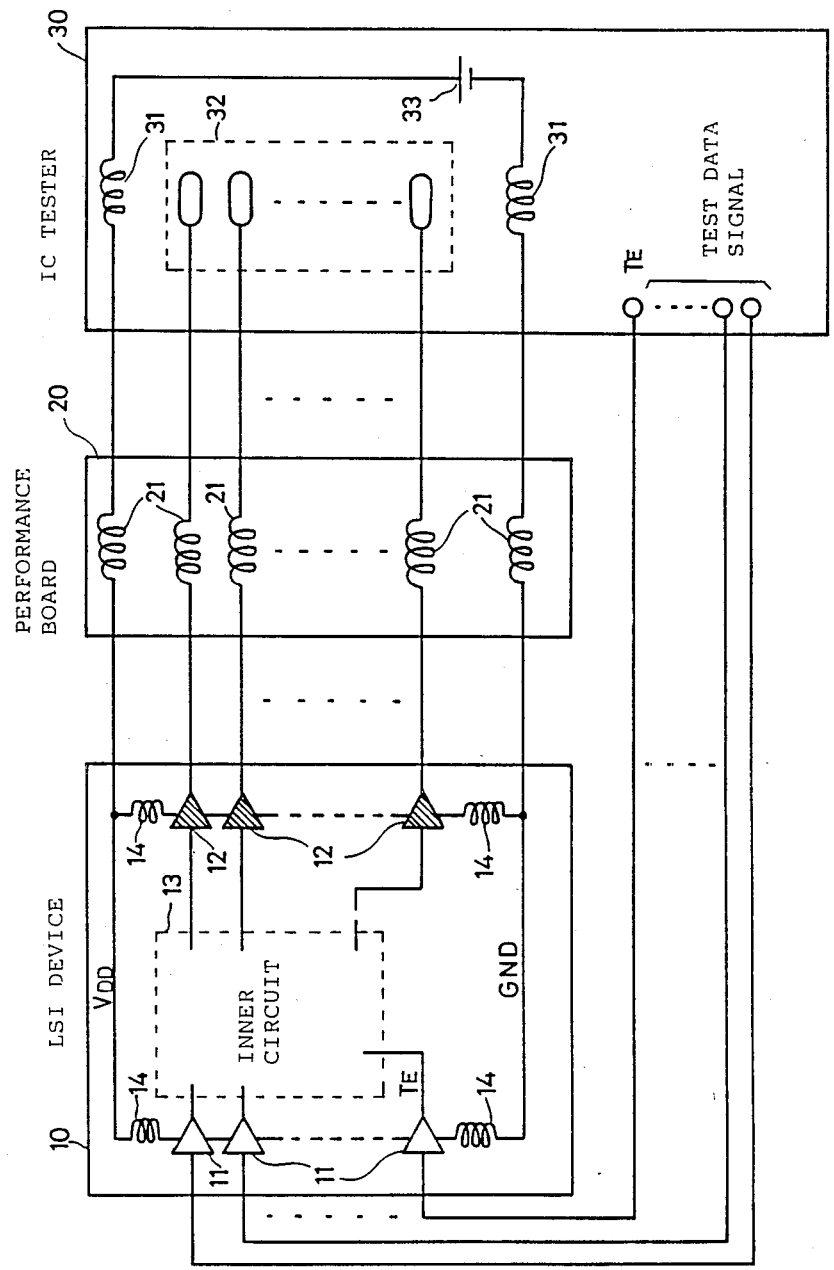
FIG. 1 is a schematic illustration showing an interconnection between a typical semiconductor integrated circuit device and a device for testing the performance of the integrated circuit device.

Referring to FIG. 4A, there are illustrated a novel IC device 10 and an IC tester 30 connected to each other for testing the performance of the IC device. A novel feature of the IC device 10 shown in FIG. 4A which distinguishes itself from the prior-art IC device of FIG. 1 is that the IC device 10 includes improved output buffers 15. The output buffers 15 are connected to be supplied with test enable signals $T_E$ from the IC tester 30. Otherwise, the arrangement of FIG. 4A is identical to that of FIG. 1, and no further description is given.

Figure 2:
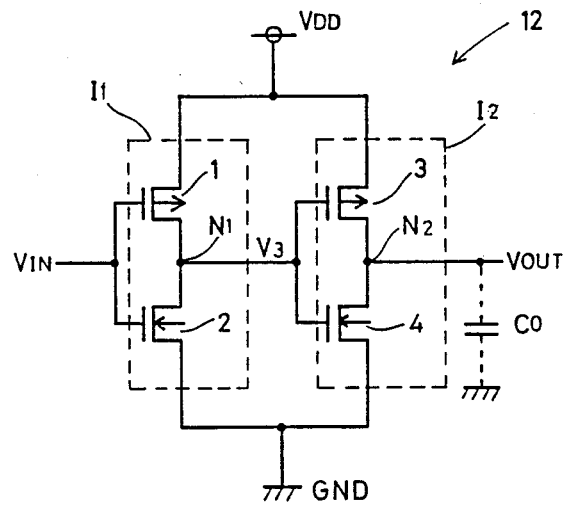
FIG. 2 is a circuit diagram of a conventional output buffer circuit.
Figure 3:
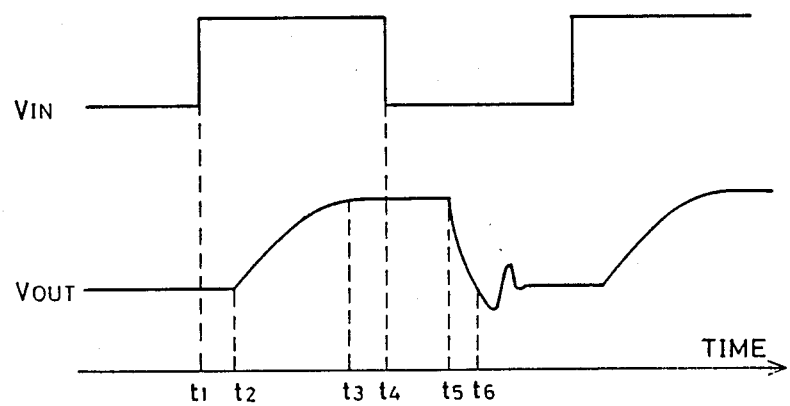
FIG. 3 is a timing diagram for input and output signals associated with the output buffer circuit of FIG. 2.
Figure 4B:
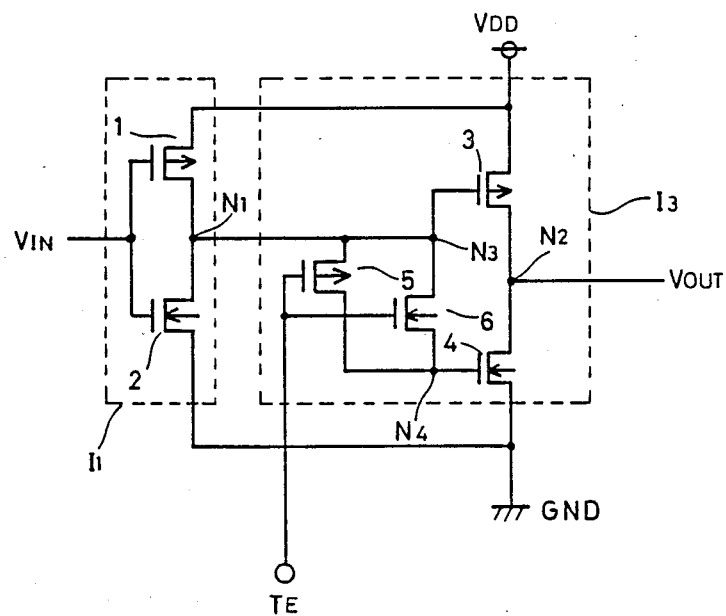
FIG. 4B is a circuit diagram of the output buffer shown in FIG. 4A.

Referring to FIG. 4B, there is shown a circuit configuration of one output buffer circuit of FIG. 4A. In contrast to the prior-art output buffer circuit shown in FIG. 2, the output buffer circuit of FIG. 4B includes additional P-channel MOSFET 5 and N-channel MOSFET 6 provided in the inverter $T_3$. The FETs 5 and 6 are connected parallel to each other between a node $N_3$ in communication with the gate of the FET 3 and a node $N_4$ in communication with the gate of the FET 4. The gates of the FETs 5 and 6 are connected together to receive test enable signals $T_E$ which are supplied by a test signal generating circuit (not shown). In normal operation, the test enable signal $T_E$ is of "L" level, and in the testing mode of operation the signal $T_E$ is of "H" level. The node $N_3$ is in communciation with the output node $N_1$ of the inverter $I_1$. Otherwise the circuit configuration of FIG. 4B is generally identical to that of FIG. 2, and no further desription is given.

Figure 5A:
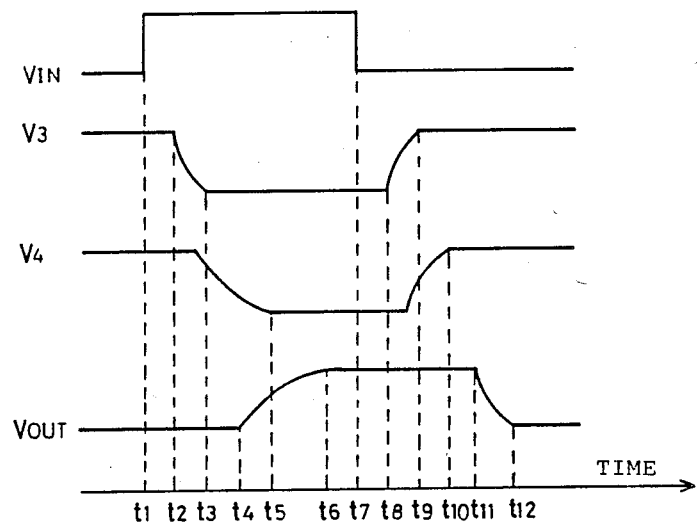
FIGS. 5A and 5B are timing diagrams for the output buffer of FIG. 4B.

Now to describe the operation of the illustrated output buffer circuit in normal operating mode where the test enable signal $T_E$ is at the "L" level with reference to FIG. 5A. In FIG. 5A, there is shown a timing diagram for the output signal $V_{IN}$, the voltage $V_3$ at the node $N_3$, the voltage $V_4$ at the node $N_4$ and the output signal $V_{OUT}$ during the normal operation of the output buffer circuit. In the normal operating mode, the test enable signal $T_E$ is kept at the "L" level with one FET conducting and the other FET non-conducting. Under the conditions, as the input signal $V_{IN}$ shifts from the "L" level to the "H" level at time $t_1$, the "H" level voltage is applied to the gates of the FETs 1 and 2, thereby rendering the FET 1 non-conductive and the FET 2 conductive. Consequently, the voltage $V_3$ at the node $N_3$ starts to fall off from the "H" level to the "L" level at $t_2$ when a predetermined delay time defined by the CMOS inverter $I_1$ has elapsed after $t_1$, and it finally settles down to the "L" level at $t_3$. The application of this low level potential to the gate of the FET 3 drives the FET into conduction.

On the other hand, when the voltage $V_3$ of the node $N_3$ reaches the threshold voltage of the FET 5, this potential change is transmitted through the conducting FETs to the node $N_4$, bringing the voltage $V_4$ at the node $N_4$ from the "H" level to the "L" level at $t_5$. As the voltage $V_4$ at the node $N_4$ falls below the threshold voltage of the FET 4 during the time interval $t_3$-$t_5$, the FET 4 is rendered non-conducting. When this happens, the "H" level output signal $V_{OUT}$ at the node $N_4$ start rising at $t_4$ upon the passage of the delay time provided by the CMOS inverter $I_2$ and reaches the "H" level at $t_6$.

Then a $t_7$ the input signal $V_{IN}$ shifts from the "H" level to the "L" level, causing the FET 1 to be conductive and the FET 2 to be non-conductive. The voltage $V_3$ at the node $N_3$ begins to rise from the "L" level at $t_8$ upon the lapse of the delay time provided by the CMOS inverter $I_1$ subsequent to $t_7$ and it reaches to the "H" level at $t_9$. This high level voltage $V_3$ is applied to the gate of the FET 3, driving the FET 3 non-conductive.

On the other hand, the voltage $V_3$ at the node $N_3$ rises to the level of the threshold voltage of the FET 5, this potential change is transmitted through the presently conducting FET 5 to the node $N_4$, bringing the voltage $V_4$ on the node $N_4$ upward from the "L" level to the "H" level at $t_{10}$. As the voltage $V_4$ at the node $N_4$ rises above the threshold voltage of the FET 4 during the time interval $t_9$-$t_{10}$, the FET 4 is rendered conductive. As a result, the output signal $V_{OUT}$ at the node $N_2$ begins to fall at $t_{11}$ when the delay time provided by the CMOS inverter $I_2$ has passed, and it reaches the "L" level at $t_{12}$.

Now to compare the time interval $t_3$-$t_5$ during which the voltage $V_4$ at the node $N_4$ drops from the "H" level to the "L" level and the time interval $t_9$-$t_{10}$ through which the same voltage goes from the "L" level up to the "H" level, it will be readily seen in FIG. 5A that the falling interval $t_3$-$t_5$ is longer than the rising interval $t_9$-$t_{10}$. The reason for this is as follows. The P-channel MOSFET 5 is of such characteristic that its threshold voltage decreases as the source-bulk voltage decreases. In a situation where the voltage $V_3$ at the node $N_3$ shifts from the "H" level down to the "L" level, a decrease in the voltage $V_3$ at the node $N_3$, thus in the source voltage, brings about a corresponding reduction in the threshold voltage of the FET 5. Consequently, it takes longer for the drain voltage $V_4$ to shift from the "H" level down to the "L" level than for the source voltage to shift from the "H" level down to the "L" level. In a situation where the voltage $V_3$ at the node $N_3$ shifts from the "L" level up to the "H" level, the time required for the voltage $V_4$ at the node $N_4$ to rise from the "L" level to the "H" level is not so long as the time for the voltage $V_4$ to fall from the "H" level to the "L" level in the situation stated above.

As described hereinabove, in the normal mode of operation, as the voltage $V_3$ at the node $N_3$ undergoes a change from the "H" level to the "L" level, the voltage $V_4$ applied to the gate of the FET 4 by means of the P-channel MOSFET 5 increases gradually, driving the FET 4 slowly into a non-conductive state. The result is that the rising waveform of the output signal $V_{OUT}$ is more gentle than in the prior art.

Figure 5B:
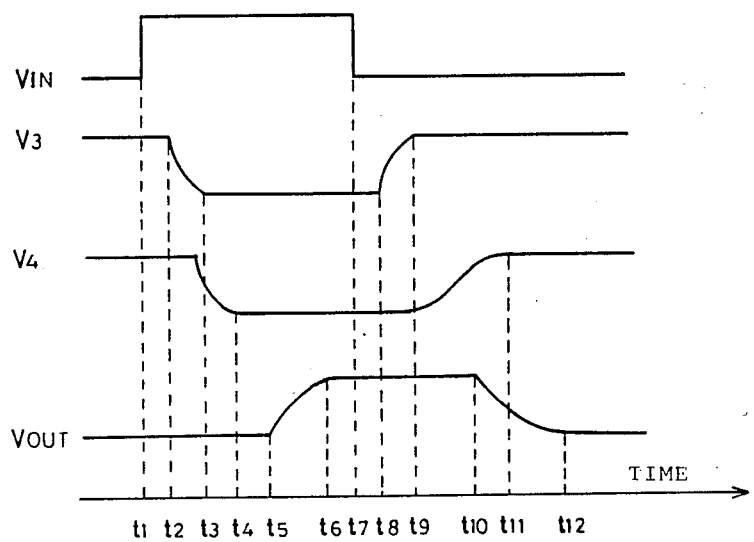

Now to describe the operation of the output buffer circuit during a test mode where the test enable signal $T_E$ is at the "H" level. Referring to FIG. 5B, there is illustrated a timing diagram for the output signal $V_{IN}$, the voltage $V_3$ at the node $N_3$, the voltage $V_4$ at the node $N_4$ and the output signal $V_{OUT}$ in the testing mode of operation. With the application of the "H" level test enable signal $T_E$, the FET 6 is made conductive, while the FET 5 is made nonconductive. During the time interval $t_1$-$t_3$, procedures similar in the normal mode of operation take place. Thus, when the input signal $V_{IN}$ shifts from the "L" level to the "H" level at $t_1$, the voltage $V_3$ at the node $N_3$ starts dropping from the "H" level to the "L" level at $t_2$ subsequent to the lapse of the delay time defined by the CMOS inverter $I_1$, and it reaches to the "L" level at $t_3$. This low level voltage is applied to the gate of the FET 3, rendering the FET 3 conductive.

On the other hand, as the voltage $V_3$ at the node $N_3$ falls to the level of the threshold voltage of the FET 6, the voltage change is transmitted through presently conducting FET 6 to the node $N_4$, bringing the voltage $V_4$ at the node $N_4$ from the "H" level down to the "L" level at $t_4$. As the voltage $V_4$ at the node $N_4$ falls below the threshold voltage of the FET 4 during the time interval $t_3$-$t_4$, the FET 4 is driven nonconductive. Then the low level output signal $V_{OUT}$ at the node $N_2$ starts to go up toward the "H" level at $t_5$ subsequent to the passage of the delay time defined by the CMOS inverter $I_2$, and it reaches the "H" level at $t_6$.

Next, when the input signal $V_{IN}$ shifts from the "H" level to the "L" level at $t_7$ as in the normal operation mode, the voltage $V_3$ at the node $N_3$ begins rising from the "L" level to the "H" level at $t_8$ upon the lapse of the delay time defined by the CMOS inverter $I_1$, and it reaches the "H" level at $t_9$. Consequently, the high level voltage is applied to the gate of the FET 3, driving the FET 3 nonconductive.

On the other hand, as the voltage $V_3$ at the node $N_3$ rises to the level of the threshold voltage of the FET 6, the change of potential is transmitted through the FET 6 to the node $N_4$. This in turn causes the voltage $V_4$ at the node $N_4$ to rise from the "L" level and reach the "H" level at $t_{11}$. During the time interval $t_9$-$t_{11}$, when the voltage $V_4$ at the node $N_4$ drops below the threshold voltage of the FET 4, the FET 4 is driven into conduction. In consequence, the high level output signal $V_{OUT}$ at the node $N_2$ starts to fall at $t_{10}$ subsequent to the lapse of the delay time provided by the CMOS inverter $I_2$, and it attains the "L" level at $t_{12}$.

In comparing the time interval $t_3$-$t_4$ during which the voltage $V_4$ at the node $N_4$ falls from the "H" level to the "L" level with the time interval $t_9$-$t_{11}$ where the voltage $V_4$ rises from the "L" level to the "H" level, it is obvious from FIG. 5B that the rising time interval $t_9$-$t_{11}$ is longer than the falling time interval $t_3$-$t_4$. This is chiefly because of the fact that the threshold voltage of the N-channel MOSFET 6 increases as its source to bulk voltage increases. Thus, in a situation where the voltage $V_3$ at the node $N_3$ shifts from the "L" level to the "H" level, the threshold voltage of the FET 6 increases as the voltage of the node $N_3$, thus of the source voltage increases. As a result, it takes longer for the drain voltage to shift from the "L" level to the "H" level than for the source voltage to shift from the "L" level to the "H" level. In contrast, in a situation where the voltage $V_3$ at the node $N_3$ changes from the "H" level to the "L" level, the length of time required for the voltage $V_4$ at the node $N_4$ to switch from the "H" level to the "L" level is not so long as in the aforementioned situation.

As has been described, while the voltage $V_3$ at the node $N_3$ switches from the "L" level to the "H" level during the testing mode, the potential $V_4$ applied to the gate of the FET 4 through the operation of the N-channel MOSFET 6 rises gradually, thereby driving the FET 4 slowly into conduction. The waveform of the falling output signal $V_{OUT}$ is more gentle than in the prior art as shown in FIG. 5B. The result is that undershoot and ringing during the time when the output signal falls off in the testing mode is eliminated or at least reduce to a minimum.

It should be pointed out here that the time required for the voltage $V_4$ at the node $N_4$ to rise to the "H" level during the testing mode is controlled by the length and width of the gate of the P-channel MOSFET 5. Accordingly, it is possible to adjust as desired the waveform of the falling output signal $V_{OUT}$ during the test mode by suitably selecting the gate length and width of the FET.

While the output buffer circuit comprising a pair of inverter circuits $I_1$ and $I_2$ has been described as a preferred embodiment of the invention, the present invention is applicable to an output buffer circuit comprising a single inverter circuit $I_2$.

As is obvious from the foregoing description of the invention, since the output signal of the inverter circuit shown in FIG. 4B goes up gradually, undershoot and ringing are effectively prevented from occurring during the falling period of the output signal. In other words, the inverter circuit generates stable output signals.

When the inverter circuit of FIG. 4A is incorporated into the output buffer circuit of the IC circuit device shown in FIG. 4A, there is caused no undershoot or ringing in the output signal during the testing of the IC circuit device, contributing to the stabilization of the supply voltage in the IC tester employed to test the performance of the IC circuit device. Thus, the IC circuit device to be tested produces stable output signals accurately and exactly representing the test results.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An inverter circuit connected between a power supply ($V_{DD}$) and a ground (GND) for inverting an input signal supplied thereto into an output signal inverted with respect to the input signal comprising:
    a first field effect device (3) of one conductivity type and a second field effect device (4) of the opposite conductivity type which are connected in series between said power supply ($V_{DD}$) and said ground (GND),
    said first field effect device (3) having its control electrode connected to receive the input signal, and
    said second field effect device (4) having on-resistance lower than said first field effect device (3);
    means for receiving a signal for designating a predetermined operating mode; and
    delay means connected to receive said input signal for delaying said input signal in response to said operating mode designating signal;
    said second field effect device (4) having its control electrode connected to receive said input signal after being delayed by said delay means.

2. An inverter circuit according to claim 1 wherein said delay means comprises a third field effect device (6) of the opposite conductivity type, whose control electrode is connected to receive said mode designating signal, and said second field effect device (4) has its control electrode connected to receive said input signal through said third field effect device (6).

3. An inverter circuit according to claim 2 wherein said delay means further comprises a fourth field effect device (5) of one conductivity type whose control electrode is connected to receive said mode designating signal, and said second field effect device (4) has its control electrode connected to receive said input signal through said fourth field effect device (5).

4. An input inverter according to claim 1 wherein said one conductivity type is P-type, and said opposite conductivity type is N-type.

5. A semiconductor integrated circuit device having a testing mode of operation comprises:
    means for receiving an externally applied signal for designating the testing mode;
    testing circuit means for executing said testing mode of operation and providing a test result signal representing a test result upon receipt of said test mode designating signal; and
    output buffer means connected to the output of said test circuit means;
    said output buffer means comprising:
    a first field effect device (3) of one conductivity type and a second field effect device (4) of the opposite conductivity type connected in series between a power supply ($V_{DD}$) and a ground (GND),
    said first field effect device (3) having its control electrode connected to receive said test result signal,
    said second field effect device (4) having an on-resistance lower than said first field effect device (3),
    delay means connected to receive said test result signal to delay said test result signal in response to of said test mode designating signal,
    said second field effect device (4) having its control electrode connected to receive said test result signal after having been delayed by said delay means.

6. A semiconductor integrated circuit device according to claim 5, wherein said delay means comprises a third field effect device (6) of the opposite conductivity type whose control electrode is connected to receive said test mode designating signal, and said field effect device (4) has its control electrode connected to receive said test result signal.

7. A semiconductor integrated circuit device according to claim 6 wherein said delay means further comprises a fourth field effect device (5) of one conductivity type whose control electrode is connected to receive said test mode designating signal, and said second field effect device (4) has its control electrode connected to receive said test result signal through said fourth field effect device (5).

8. A semiconductor integrated circuit device according to claim 5 wherein said one conductivity type is P-type, and said opposite conductivity type is N-type.

9. An inverter circuit comprising:
   a load element connected between an a output node and a source of a first voltage;
   a first N-type field effect transistor having (a) a first source/drain terminal connected to said output node, (b) a second source/drain terminal connected to a source of a second voltage, said second votlage being lower than said first voltage, and (c) a gate electrode;
   a first P-type field effect transistor having (a) a first source/drain electrode connected to an input node, (b) a second source/drain electrode connected to said gate of said first N-type field effect transistor, and (c) a gate electrode connected to receive a control signal; and
   a second N-type field effect transistor having (a) a first source/gate electrode connected to said input node and to said first source/drain electrode of said first P-type field effect transistor, (b) a second source/drain electrode connected to said gate of said first N-type transistor and to said second source/drain electrode of said first P-type field effect transistor, and (c) a gate electrode connected to said fate electrode of said first P-type field effect transistor to receive said control signal.

10. The inverter circuit according to claim 9, wherein said load element comprises a second P-type field effect transistor having first and second source/drain electrodes connected to said source of said first voltage and to said output node, respectively.

11. The inverter circuit according to claim 10, wherein said second P-type field effect transistor has a gate electrode connected to said input node.

12. The inverter circuit according to claim 11, wherein said control signal includes a designation signal for designating a test mode.

13. The inverter circuit according to claim 12, wherein said designation signal is a low level potential when a normal mode is designated, and is high level potential when the test mode is designated.

14. An output buffer circuit comprising:
   a first load element connected between an a output node and a source of a first voltage;
   a first N-type field effect transistor having (a) a first source/drain terminal connected to said output node, (b) a second source/drain terminal connected to a source of a second voltage, said second voltage being lower than said first voltage, and (c) a gate electrode;
   a first P-type field effect transistor having (a) a first source/drain electrode connected to an intermediate node, (b) a second source/drain electrode connected to said gate of said first N-type field effect transistor, and (c) a gate electrode connected to receive a control signal;
   a second N-type field effect transistor having (a) a first source/gate electrode connected to said intermediate node and to said first source/drain electrode of said first P-type field effect transistor, (b) a second source/drain electrode connected to said gate of said first N-type transistor and to said second source/drain electrode of said first P-type field effect transistor, and (c) a gate electrode connected to said gate electrode of said first P-type field effect transistor to receive said control signal;
   a second load element connected between said intermediate node said source of said first voltage; and
   a third N-type field effect transistor having (a) a first source/drain electrode connected to said intermediate node, (b) a second source/drain electrode connected said source of said second voltage, and (c) a gate electrode connected to an input node.

15. The output buffer according to claim 14, wherein said first load element comprises a second P-type field effect transistor having first and second source/drain electrodes connected to said source of said first voltage and to said output node, respectively; and
   said second load element comprises a third P-type field effect transistor having first and second source/drains connected to said source of said first voltage and to said intermediate node, respectively.

16. The output buffer according to claim 15, wherein said second P-type field effect transistor has a gate electrode connected to said intermediate node.

17. The output buffer circuit according to claim 15, wherein said third P-type field effect transistor has a gate electrode connected to said input node.

18. The output buffer according to claim 15, wherein said second P-type field effect transistor has a gate electrode connected to said intermediate node; and
   said third P-type field effect transistor has a gate electrode connected to said input node.

19. The output buffer circuit according to claim 14, wherein said control signal includes a designation signal for designating a test mode.

20. The inverter circuit according to claim 19, wherein said designation signal is a low level potential when a normal mode is designated, and ia high level potential when the test mode is designated.

* * * * *